United States Patent
Zhao et al.

[11] Patent Number: 5,956,613
[45] Date of Patent: Sep. 21, 1999

[54] METHOD FOR IMPROVEMENT OF TIN CVD FILM QUALITY

[75] Inventors: Joe W. Zhao, San Jose; Wilbur G. Catabay, Santa Clara, both of Calif.

[73] Assignee: LSI Logic Corporation, Milpitas, Calif.

[21] Appl. No.: 08/579,383

[22] Filed: Dec. 27, 1995

[51] Int. Cl.[6] .............................................. H01L 21/4763
[52] U.S. Cl. .................. 438/648; 438/681; 438/683; 427/255.2
[58] Field of Search .................................. 437/190, 192, 437/195; 427/528, 530, 533, 534, 255.1, 255.2, 255.7, 535; 438/228, 218, 233, 649, 675, 676, 681, 533, 648; 458/683

[56] References Cited

U.S. PATENT DOCUMENTS

| | | | |
|---|---|---|---|
| 5,010,032 | 4/1991 | Tang et al. | 437/57 |
| 5,399,379 | 3/1995 | Sandhu | 427/255.2 |
| 5,487,922 | 1/1996 | Nieh et al. | 427/528 |
| 5,591,671 | 1/1997 | Kim et al. | 437/190 |
| 5,747,116 | 5/1998 | Sharan et al. | 427/534 |

*Primary Examiner*—Tuan H. Nguyen
*Assistant Examiner*—Reneé R. Berry

[57] ABSTRACT

A method of depositing a low carbon content, high density TiN thin film on a substrate. A substrate is placed within a deposition chamber, and the pressure within the deposition chamber is adjusted to the deposition pressure. A portion of the total thickness desired of the TiN thin film is deposited. The portion of the TiN thin film contains an amount of carbon. Carbon is scavenged from the portion of the TiN thin film deposited by introducing scavenger gases into the deposition chamber. The scavenger gases are chosen so as to be reactive with carbon. The pressure within the deposition chamber is adjusted to the scavenger pressure, and a plasma of the scavenger gases is created within the deposition chamber. The steps from deposition through scavenging are repeated until the desired thickness of TiN is deposited, and the substrate having the desired thickness of TiN deposited thereon is removed from the deposition chamber.

13 Claims, 2 Drawing Sheets

METHOD FOR IMPROVEMENT OF TiN CVD FILM QUALITY

FIELD OF THE INVENTION

This invention relates to the field of material deposition. More particularly the invention relates to the field of depositing high purity thin films for application in the semiconductor manufacturing industry.

BACKGROUND OF THE INVENTION

Semiconductor devices, such as transistors, are generally formed in monolithic pieces of a semiconducting material, such as silicon. Up to several millions of these discrete devices are then electrically connected one to the other by use of layers of metal thin films. One of the most common metals used for these electrical interconnects is aluminum. Unfortunately, aluminum creates certain problems when in contact with the semiconductor material. For example, when aluminum is in direct contact with silicon, the most commonly used semiconductor material, the aluminum tends to continually diffuse through the silicon during subsequent heating processes. Aluminum diffusion can eventually short out the device formed in the silicon.

To prevent problems such as that described above, so-called barrier layers of metal-based thin films are placed between the aluminum layer and the semiconductor substrate. The barrier layers inhibit the diffusion of aluminum into the semiconductor substrate. This decreases the occurrence of device failure due to aluminum penetration.

One of the materials used as a barrier layer is TiN. TiN is a favored barrier material because of its relatively high density. This characteristic of TiN helps reduce aluminum diffusion because the aluminum atoms cannot migrate easily through the dense TiN thin film.

Because it tends to produce a relatively conformal coating, chemical vapor deposition (CVD) is a highly favored method of depositing TiN. However, CVD TiN may contain a greater amount of carbon than does TiN deposited by certain other methods. The relatively higher carbon content tends to reduce the density of the TiN thin film produced by CVD. The reduction in film density commensurately reduces the effectiveness of the TiN thin film as a barrier layer.

To reduce the amount of carbon in a TiN thin film deposited by CVD, scavenger gases are intermittently introduced into the deposition chamber under conditions which favor a reaction between the carbon in the TiN thin film and the scavenger gases. This removes the carbon from the TiN thin film, and increases the film density.

When a substrate has a relatively planar topology, the scavenger gases can contact all regions of the TiN thin film quite readily. However, when a substrate has relatively deep, narrow channels, such as vias, the scavenger gases do not as readily migrate to the portions of the TiN thin film which are at the bottom of such channels. Unfortunately, a dense TiN thin film is especially desired at the bottom of vias, because the metal interconnect layers contact the semiconducting material at these points.

What is needed, therefore, is a method of improving the quality of a TiN CVD thin film, by removing the carbon inherently deposited in the film, and thus increasing the density of the TiN thin film. What is further needed is such a method which is effectual for TiN thin films which are deposited on substrates having relatively deep, narrow channels.

SUMMARY OF THE INVENTION

The above and other needs are met by a method of depositing a low carbon content, high density TiN thin film on a substrate. A substrate is placed within a deposition chamber, and the pressure within the deposition chamber is adjusted to a deposition pressure. A portion of the TiN thin film is deposited by decomposing a carbon-containing precursor gas on the substrate.

Scavenger gases are introduced into the deposition chamber, and the pressure within the deposition chamber is adjusted to a scavenging pressure. The scavenger gases are chosen so as to be reactive with carbon. A plasma of the scavenger gases is created within the deposition chamber. Carbon is scavenged from the deposited portion of the TiN thin film for a length of time. The steps of deposition and scavenging are repeated intermittently until the desired thickness of TiN is deposited.

BRIEF DESCRIPTION OF THE DRAWINGS

Further advantages of the invention will become apparent by reference to the detailed description of the invention when considered in conjunction with the following drawings, in which like reference numerals denote like elements throughout the several views, and wherein.

DETAILED DESCRIPTION OF THE INVENTION

Figure 2:
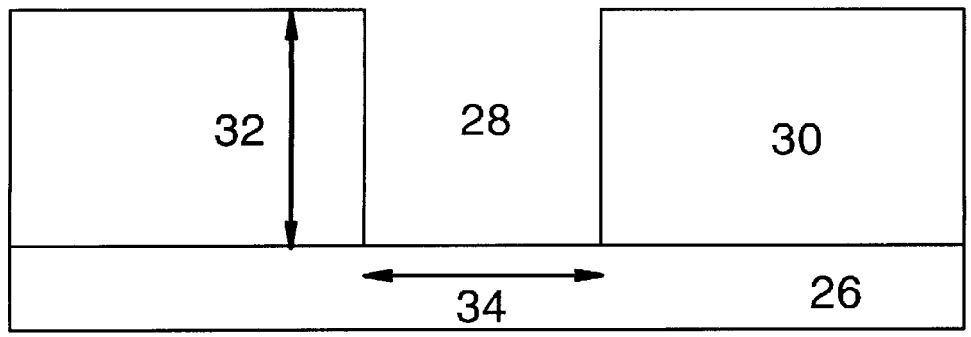
FIG. 2 is a cross-sectional view of a substrate with topographical features.

Referring now to the drawings, there is depicted in FIG. 2 a cross-sectional view of substrate 26. The substrate 26 preferably comprises a semiconducting material such as germanium, a III–V compound such as gallium arsenide, or most preferably silicon. Such substrates are commonly used in the manufacture of integrated semiconductor devices such as, by way of example and not limitation, PROM, EPROM, EEPROM, PAL, FPL, ROM, RAM, and ASIC. All such semiconductor devices with metal interconnect layers as described herein may be benefited by application of a method according to the present invention.

There are on the substrate 26 topographical features such as via 28 defined in layer 30. Layer 30 may be comprised of several different layers of the type typically found in integrated circuits. Such layers may include, for example, field oxide, glass, and previously deposited metal-based thin films. It will be appreciated that the present invention is equally applicable to substrates 26 which do not have topographical features such as via 28. However, the invention is particularly beneficial in improving the quality of a TiN thin film deposited at the bottom of a feature such as via 28. As the aspect ratio of via 28 increases, or in other words as the ratio of the height 32 of via 28 to the width 34 of via 28 increases, the invention is of increasing benefit in improving the quality of the TiN thin film deposited at the bottom of via 28.

Figure 1:
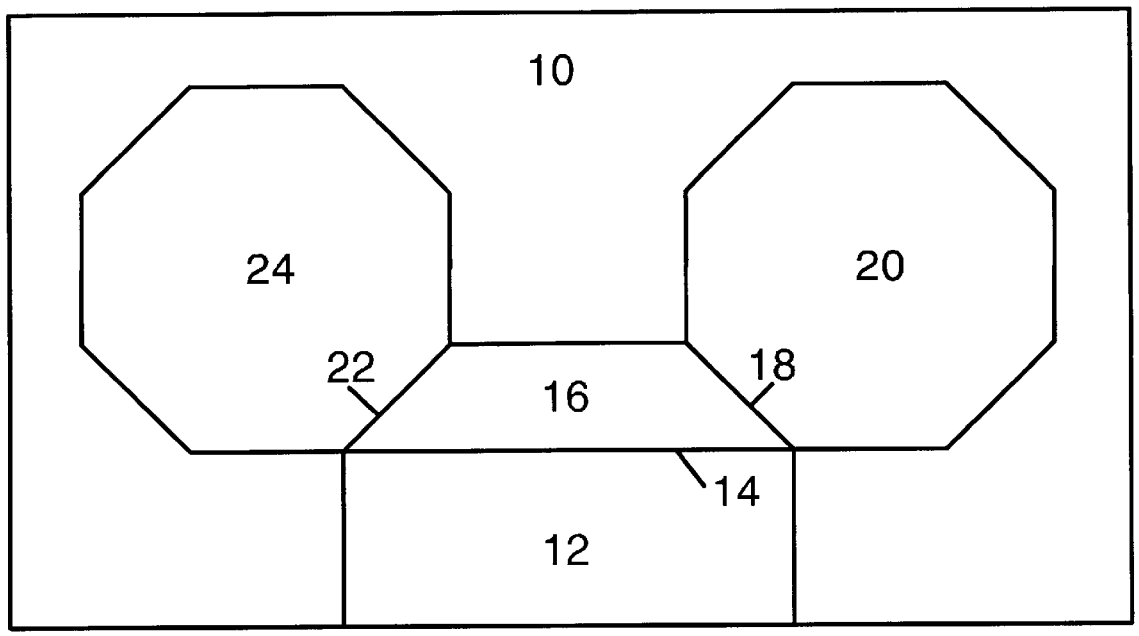
FIG. 1 is a top plan view of a deposition apparatus.

The TiN thin film is deposited by placing the substrate 26 within a deposition system, such as cluster tool 10 depicted in FIG. 1, in which the processing conditions may be precisely controlled. Cluster tools 10 which may be used for a method of the present invention include, by way of example, model P5000 manufactured by AMT of Santa Clara, Calif., model Centura manufactured by AMT of Santa Clara, Calif., model Phoenix manufactured by MRC of Phoenix, Ariz., and model 7000 manufactured by Genus of Sunnyvale, Calif.

The substrate 26 is brought into the cluster tool 10 by placing it in the automated staging area 12. From there the substrate 26 is brought through air lock 14 into the common area 16. Once the substrate 26 is brought inside of the common area 16, the air lock 14 is closed, and a vacuum is formed within the common area 16. After the vacuum is formed, air lock 18 is opened and the substrate 26 is introduced to the deposition chamber 20. The air lock 18 is closed once the substrate 26 is placed within the deposition chamber 20.

The TiN thin film may be deposited by a CVD process. The CVD process is favored because it produces a TiN thin film which is highly conformal to the topographical features of the substrate 26. The temperature within the deposition chamber 20 is adjusted to the deposition temperature, which in the preferred embodiment is between about 300° C. and about 475° C., and most preferably about 400° C.

A precursor gas is introduced into the deposition chamber 20. The precursor gas reacts within the deposition chamber 20 at the deposition temperature to produce the TiN thin film on the exposed surfaces of the substrate 26. As an example, tetrakis-dimethylamino titanium (TDMAT) is one preferred precursor gas. Tetrakis-diethylamino titanium (TDEAT) is another preferred precursor gas. The flow rate of TDMAT is preferably between about 10 sccm and about 1,000 sccm, and most preferably about 100 sccm. The flow rate of TDEAT is preferably between about 10 sccm and about 1,000 sccm, and most preferably about 100 sccm.

The pressure within the deposition chamber 20 is adjusted to the deposition pressure, which is preferably between about 15 Torr and about 150 Torr, and most preferably about 40 Torr. In alternate embodiments the CVD deposition is enhanced by inducing a plasma within the deposition chamber 20. However, in the preferred embodiment the CVD deposition is accomplished by an otherwise unaided thermal decomposition of the precursor gases.

Both TDMAT and TDEAT will decompose at the temperatures described above to form $TiN_x(C)$, where x is a number between zero and one, and a hydrocarbon gas. The $TiN_x(C)$ is deposited as a solid on the surface of the substrate 26. The hydrocarbon gas is continually flushed from the deposition chamber 20 by the flow of the unreacted precursor gas.

While in alternate embodiments the deposition is allowed to proceed until the entire desired thickness of the TiN thin film is deposited, in the preferred embodiment just a portion of the total thickness desired is deposited. Preferably, the portion deposited is between about 10 Å and about 200 Å thick, and is most preferably about 50 Å thick. The portion of the TiN thin film deposited is preferably limited to this thickness because the scavenging action described below is only effective to a depth of about 100 Å from the surface of the TiN thin film.

Figure 3:
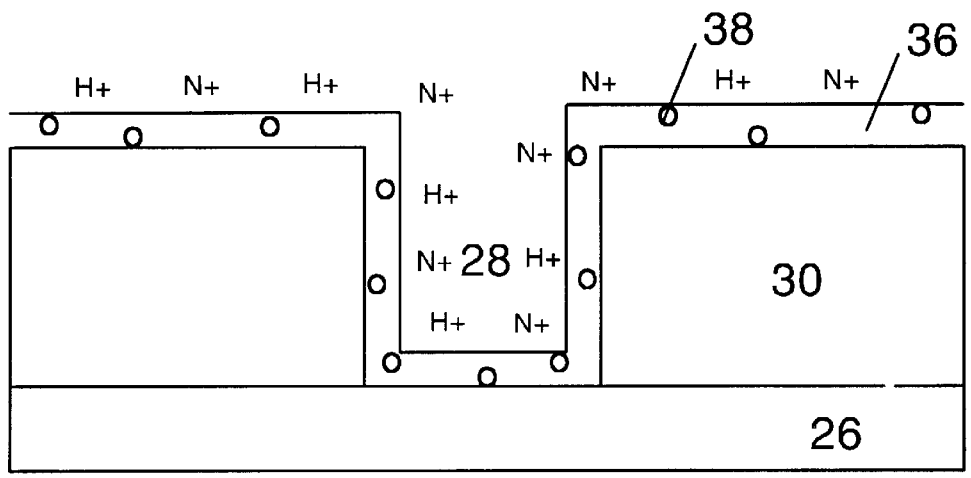
FIG. 3 is a cross-sectional view of a substrate with a TiN thin film containing carbon deposited thereon.

After this portion of the TiN thin film has been deposited, the deposition is stopped by shutting off the precursor gas. In FIG. 3 there is depicted the substrate 26 with a TiN thin film 36 deposited thereon. Within the TiN thin film 36 is carbon 38. The carbon 38 is a natural by-product of the TiN deposition process, as described above. The carbon 38 tends to decrease the density of the TiN thin film 36. The decrease in the density of the TiN thin film 36 reduces the effectivity of the TiN thin film 36 as a barrier layer.

The purpose of the TiN thin film 36 as a barrier layer is to prevent subsequently deposited metal layers from diffusing into the substrate 26. For example, a metal thin film such as aluminum layer tends to readily diffuse into a semiconducting substrate 26, and short the devices which may be formed therein.

Thus it is desirable to scavenge the carbon 38 from the portion of the TiN thin film 36 deposited. Scavenging may be accomplished in a separate scavenging chamber 24, as depicted in FIG. 1. The substrate 26 is removed from the deposition chamber 20 by opening air lock 18 and moving the substrate 26 into the common area 16. The air lock 18 is closed, and air lock 22 is opened, through which the substrate 26 may be moved into deposition chamber 24. The air lock 22 is closed, and processing continues. However, in the preferred embodiment the scavenging is done in the deposition chamber 20 where then TiN is deposited.

The scavenging is accomplished by introducing scavenging gases into the deposition chamber 20. In the preferred embodiment nitrogen and hydrogen are used as scavenging gases. The flow rate of the nitrogen is preferably between about 10 sccm and about 2,000 sccm, and most preferably about 1,000 sccm. The flow rate of the hydrogen is preferably between about 10 sccm and about 2,000 sccm, and most preferably about 1,000 sccm.

The pressure in the deposition chamber 20 is adjusted to the scavenging pressure. The scavenging pressure is preferably between about 15 Torr and about 150 Torr, and most preferably about 40 Torr. By having a scavenging pressure within this range, the scavenger gases are more likely to diffuse to the bottom of topographical features with a high aspect ratio, such as via 28. At a lower pressure, the scavenger gases would be less likely to diffuse to the bottom of such features.

The scavenging pressure then enables the scavenger gases to more completely remove the carbon 38 located at the bottom of such features, thus improving the density of the TiN thin film 36 in the region where it is closest to the semiconducting substrate 26. This is the region where the density of the TiN thin film 36 is of greatest importance, because the thin film 36 preferably inhibits diffusion at this location of a subsequently deposited metal thin film into the substrate 26.

The scavenging gases are made more reactive by inducing a plasma within the deposition chamber 20. The plasma is induced by an RF generator operating at a frequency of about 13.5 MHz and a power of between about 100 watts and about 500 watts, and most preferably about 300 watts. The plasma comprises atoms of the hydrogen and nitrogen scavenger gases which have been ionized to $H^+$ and $N^+$. The scavenger gases react with the $TiN_x(C)$ to produce the pure TiN thin film 36 and a hydrocarbon gas. The TiN thin film 36 remains as a solid on the substrate 26. The hydrocarbon gas is continually flushed from the deposition chamber 20 by the flow of the unreacted scavenging gases.

Penetration of the scavenging gases, $H^+$ and $N^+$, to the bottom of features such as via 28 may be further enhanced by applying a negative DC bias to the substrate 26. In the preferred embodiment the DC bias is applied at a potential of between about −100 volts and about −500 volts, and most preferably about −250 volts. The DC bias tends to preferentially draw the ions of hydrogen and nitrogen toward the substrate 26, and down into features such as via 28, as depicted in FIG. 3.

Figure 4:
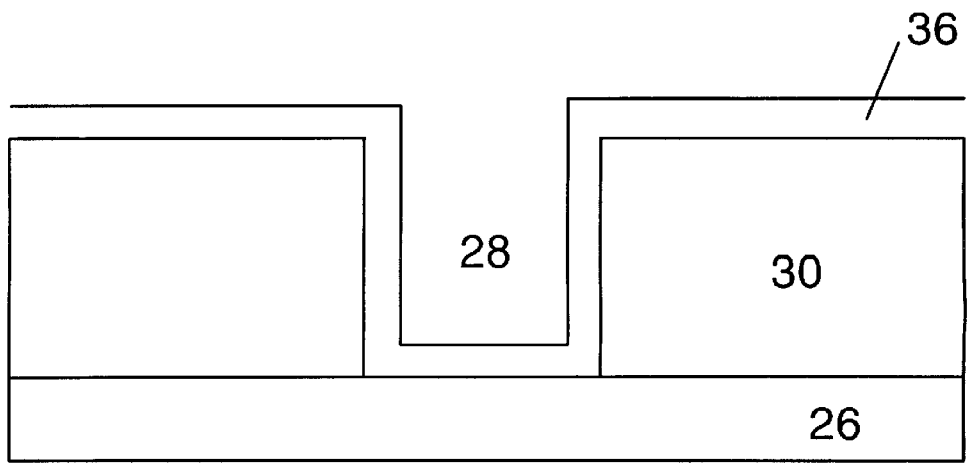
FIG. 4 is a cross-section view of a substrate with a TiN thin film from which the carbon has been scavenged.

The scavenging described above is stopped, by shutting off the RF power, and the DC bias when applied, as well as turning off the scavenger gases. After scavenging for a period of time of between of about 10 seconds and about 60 seconds, and most preferably about 10 seconds, between about 5% and about 10% of the total amount of carbon 38 within the TiN thin film 36 is removed. A cross-sectional view of a substrate 26 with a TiN thin film 36, from which the carbon 38 has been removed, is depicted in FIG. 4.

The above-described processes of depositing and scavenging are intermittently repeated until the desired thickness of the TiN thin film 36 has been deposited. In the preferred embodiment the desired thickness is between about 50 Å and about 1,000 Å, and most preferably about 200 Å. This thickness of a TiN thin film 36, deposited according to the preferred method described above, is sufficient to provide the desired degree of resistance to aluminum diffusion.

After the desired thickness of the TiN thin film 36 has been deposited, the substrate 26 is ready for further processing, and may be removed from the deposition chamber 20.

While specific embodiments of the invention have been described with particularity above, it will be appreciated that the invention is equally applicable to other processes well known to those skilled in the art.

What is claimed is:

1. A method of depositing a low carbon content, high density, highly conformal TiN thin film on a substrate comprising:
   a. placing the substrate within a deposition chamber,
   b. adjusting the pressure within the deposition chamber to a deposition pressure of between about 15 Torr and about 150 Torr,
   c. depositing a portion of the TiN thin film by decomposing a carbon-containing precursor gas on the substrate,
   d. introducing scavenger gases into the deposition chamber, the scavenger gases chosen so as to be reactive with carbon,
   e. adjusting the pressure within the deposition chamber to a scavenger pressure,
   f. creating a plasma of the scavenger gases within the deposition chamber,
   g. scavenging carbon from the portion of the TiN thin film deposited for a length of time, and
   h. repeating steps (b) through (g) until the desired thickness of TiN is deposited.

2. The method of claim 1 wherein the step of depositing a portion of the TiN thin film further comprises chemical vapor deposition.

3. The method of claim 1 wherein the step of depositing a portion of the TiN thin film further comprises depositing at a temperature of between about 300° C. and about 475° C.

4. The method of claim 1 wherein the scavenging pressure is from about 15 Torr to about 150 Torr.

5. The method of claim 1 wherein the scavenging gases are selected from the group consisting of nitrogen gas and hydrogen gas.

6. The method of claim 1 wherein the plasma is induced at a power of between about 100 watts and about 500 watts.

7. The method of claim 1 wherein the step of depositing a portion of the TiN thin film further comprises depositing TiN to a thickness of between about 10 Å and about 200 Å.

8. The method of claim 1 wherein the step of scavenging further comprises scavenging for a period of time of between about 10 seconds and about 60 seconds.

9. The method of claim 1 wherein the desired thickness of the TiN thin film is between about 50 Å and about 1,000 Å.

10. The method of claim 1 wherein the step of scavenging further comprises applying a negative DC bias to the substrate of between about −100 volts and about −500 volts.

11. A method of depositing a low carbon content, high density, highly conformal TiN thin film on a substrate comprising:
    a. placing the substrate within a deposition chamber,
    b. adjusting the pressure within the deposition chamber to a deposition pressure between about 15 Torr and about 150 Torr,
    c. depositing between about 10 Å and about 200 Å of a TiN thin film by decomposing a carbon-containing precursor gas on the substrate at a temperature of between about 300° C. and about 475° C.,
    d. introducing scavenger gases of nitrogen and hydrogen into the deposition chamber,
    e. adjusting the pressure within the deposition chamber to a scavenging pressure between about 15 Torr and about 150 Torr,
    f. creating a plasma of the scavenger gases within the deposition chamber, the plasma being induced at a power of between about 100 watts and about 500 watts,
    g. applying a negative DC bias to the substrate of between about −100 volts and about −500 volts,
    h. scavenging carbon from the portion of the TiN thin film deposited for a period of time of between about 10 seconds and about 60 seconds, and
    i. repeating steps (b) through (h) until a total thickness of between about 50 Å and about 1,000 Å of the TiN thin film is deposited.

12. A method of making a semiconductor device, the improvement comprising a TiN barrier layer formed according to the method of claim 11.

13. A method of making a semiconductor device, the improvement comprising a TiN barrier layer formed according to the method of claim 1.

* * * * *